(12) United States Patent
Myers et al.

(10) Patent No.: US 10,099,463 B1
(45) Date of Patent: Oct. 16, 2018

(54) METHOD OF MANUFACTURING A LAMINATED SOFT GOOD

(71) Applicant: L&P Property Management Company, South Gate, CA (US)

(72) Inventors: Terrance L. Myers, Joplin, MO (US); Matthew C. Smallwood, Webb City, MO (US)

(73) Assignee: L&P Property Management Company, South Gate, CA (US)

( * ) Notice: Subject to any disclaimer, the term of this patent is extended or adjusted under 35 U.S.C. 154(b) by 0 days.

(21) Appl. No.: 15/483,267

(22) Filed: Apr. 10, 2017

(51) Int. Cl.
*B32B 5/26* (2006.01)
*B32B 15/06* (2006.01)
(Continued)

(52) U.S. Cl.
CPC ............... *B32B 37/12* (2013.01); *B32B 5/26* (2013.01); *B32B 37/06* (2013.01); *B32B 37/10* (2013.01);
(Continued)

(58) Field of Classification Search
CPC ........... B32B 7/12; B32B 27/08; B32B 15/08; B32B 15/20; B32B 2305/022; B32B 27/38; B32B 27/40; B32B 37/12; B32B 5/26; B32B 15/06; B32B 15/088; B32B 15/092; B32B 15/095; B32B 15/18; B32B 2250/03; B32B 2255/10; B32B 2255/26; B32B 2264/10; B32B 2270/00; B32B 2305/026; B32B 2305/18; B32B 2305/38; B32B 2307/202; B32B 2307/204; B32B 2307/306; B32B 2307/308; B32B 2307/31; B32B 2307/51; B32B 2307/514; B32B 2307/54; B32B 2307/554; B32B 2307/584; B32B 2307/714; B32B 2307/724; B32B 2307/7244; B32B 2307/7246;
(Continued)

(56) References Cited

U.S. PATENT DOCUMENTS 3,895,086 A * 7/1975 Berner .................. B29C 44/206
264/45.4
4,591,526 A * 5/1986 Grant ...................... B32B 27/12
428/198
(Continued)

FOREIGN PATENT DOCUMENTS

EP 0524564 7/1992
JP 2008190217 2/2007

OTHER PUBLICATIONS

English translation of JP2008190217.*
English translation of EP0524564.*

Primary Examiner — Sonya M Sengupta
(74) Attorney, Agent, or Firm — Wood, Herron & Evans, LLP

(57) ABSTRACT

A layered stack is created by placing webs of adhesive on opposite sides of web of cushioning layer and placing outer webs outside the webs of adhesive. An outer surface of a rotating drum is heated by heating oil inside the drum. An endless belt is heated by at least one heater. The layered stack is pulled between the heated endless belt and the heated rotating drum via a motorized drive assembly which rotates the endless belt. Both sides of the layered stack are heated enough to melt each web of adhesive when the layered stack passes between the heated moving endless belt and the heated rotating drum.

20 Claims, 9 Drawing Sheets

(51) Int. Cl.
  *B32B 15/20* (2006.01)
  *B32B 27/38* (2006.01)
  *B32B 27/40* (2006.01)
  *B32B 15/088* (2006.01)
  *B32B 37/06* (2006.01)
  *B32B 37/10* (2006.01)
  *B32B 37/12* (2006.01)
  *H01M 2/02* (2006.01)

(52) U.S. Cl.
  CPC .............. *B32B 15/06* (2013.01); *B32B 15/088* (2013.01); *B32B 15/20* (2013.01); *B32B 27/38* (2013.01); *B32B 27/40* (2013.01); *B32B 2305/022* (2013.01); *B32B 2479/00* (2013.01); *H01M 2/0287* (2013.01); *H05K 2201/012* (2013.01); *Y10T 156/1727* (2015.01); *Y10T 156/1732* (2015.01); *Y10T 156/1741* (2015.01); *Y10T 428/24099* (2015.01); *Y10T 428/24999* (2015.04); *Y10T 428/249981* (2015.04); *Y10T 428/249984* (2015.04); *Y10T 428/287* (2015.01); *Y10T 428/2857* (2015.01); *Y10T 428/2887* (2015.01); *Y10T 428/31515* (2015.04)

(58) Field of Classification Search
  CPC ........ B32B 2309/06; B32B 2310/0445; B32B 2363/00; B32B 2439/00; B32B 25/02; B32B 25/08; B32B 25/10; B32B 27/26; B32B 27/281; B32B 27/304; B32B 27/308; B32B 27/32; B32B 27/322; B32B 27/34; B32B 27/36; B32B 37/004; B32B 2439/70; B32B 2439/80; B32B 2457/08; B32B 2457/10; B32B 2555/00; B32B 37/20; B32B 37/26; B32B 3/26; B32B 5/022; B32B 5/024; B32B 5/12; B32B 5/18; B32B 5/32; B32B 7/06; B32B 37/04; B32B 37/06; B32B 37/10; B32B 37/1284; G07F 17/3244; H01M 10/0525; H01M 2/0287; H01M 2/0292; H05K 2201/012; H05K 2201/0133; H05K 2201/0355; H05K 3/281; H05K 3/386; H05K 3/4611; H05K 3/4626; Y10S 428/913; Y10T 442/15; Y10T 442/195; Y10T 156/1727; Y10T 156/1732; Y10T 156/1741; Y10T 442/153; Y10T 442/183; Y10T 442/184; Y10T 442/197; Y10T 442/3325; Y10T 442/3341; Y10T 442/335; Y10T 442/469; Y10T 428/24099; Y10T 428/24917; Y10T 428/249981; Y10T 428/249984; Y10T 428/24999; Y10T 428/253; Y10T 428/2857; Y10T 428/287; Y10T 428/2887; Y10T 428/31511; Y10T 428/31515; Y10T 428/31522; Y10T 428/249982
  USPC .............. 156/309.9, 321, 380.9, 583.1, 583.5
  See application file for complete search history.

(56) References Cited

U.S. PATENT DOCUMENTS

| | | |
|---|---|---|
| 4,634,621 A | 1/1987 | Manning et al. |
| 5,851,339 A | 12/1998 | Rucker |
| 5,981,020 A | 11/1999 | Sutherland et al. |
| 6,656,856 B1 | 12/2003 | Rucker |
| 7,722,950 B2 | 5/2010 | Guo et al. |
| 7,897,527 B2 | 3/2011 | Yoshida |
| 7,976,667 B2 | 7/2011 | Cerciello |
| 2004/0161621 A1 | 8/2004 | Nishizawa et al. |
| 2016/0089861 A1 | 3/2016 | Wang et al. |
| 2016/0275752 A1 | 9/2016 | Rosenbaum |

* cited by examiner

METHOD OF MANUFACTURING A LAMINATED SOFT GOOD

FIELD OF THE INVENTION

The present invention relates to a method of manufacturing a laminated soft good and the apparatus for performing the method.

BACKGROUND OF THE INVENTION

In the bedding industry, the outer cover of a mattress or box spring may be quilted with any desired pattern. Some customers prefer a non-quilted covering. Such non-quilted coverings may be two or more layers laminated together.

One known method for forming a laminated product is to treat one surface of a sheet with an adhesive and pass that sheet with another sheet between compression rollers to compress the adhesive between the sheets. Such an apparatus takes up much floor space in a production facility.

The assignee of the present invention has invented an apparatus which reduces the amount of space necessary to laminate multiple materials together. In other words, the footprint of the apparatus is reduced. One such apparatus used by the assignee of the present invention utilizes a heated drum containing oil and an unheated belt. Two materials are passed between the heated drum and the unheated belt. However, one drawback to this apparatus is that only two layers may be secured together with a layer of adhesive between the two layers. During its travel, the belt loses any residual heat the moving belt may have retained from passing close to the heated drum. Consequently, the side of the layered stack closest to the belt is not heated enough to secure a third material to a cushioning material. The result is that assignee's known apparatus is only able to heat two layers together; no more.

Therefore, there is a need for a laminator which utilizes a heated belt and a heated drum to laminate more than two layers together.

There is further a need for a laminator which heats both sides of a layered stack of materials to laminate more than two layers together with more than one layer of adhesive.

SUMMARY OF THE INVENTION

The present invention provides an improved method of manufacturing a laminated soft good. The method comprises applying a first layer of adhesive between a web of backing material and a first side of a web of cushioning material. The next step comprises applying a second layer of adhesive between a web of ticking material and a second side of the web of cushioning material to create a layered stack. For purposes of this document the term cushioning material includes, but is not limited to, any material containing at least some foam or some fiber or any combination thereof.

The key step in the process is heating a moving endless belt by at least one heater to create a heated moving endless belt. Each heater is preferably a radiant heater. The layered stack is fed between the heated moving endless belt and a heated rotating drum. The layered stack is compressed between the heated moving endless belt and the heated rotating drum, heat from the heated moving endless belt and heat from the heated rotating drum laminating the web of backing material, web of cushioning material and web of ticking material to create a laminated soft good. Heat from the heated moving endless belt melts a web of adhesive between the web of backing material and the web of cushioning material. Heat from the heated rotating drum melts the other web of adhesive between the web of ticking material and the web of cushioning material. The result is a three-layered laminated soft good which may be passed to a slitter or wound up in a roll for later use.

Worded another way, the method of manufacturing a laminated soft good having at least three layers comprises applying a first layer of adhesive to one side of a first outer web of material. The next step comprises placing a web of cushioning material over the first layer of adhesive to create a sub-stack and moving the sub-stack downstream. The next step comprises applying a second layer of adhesive to an exposed of the web of cushioning material and placing a second outer web of material over the second layer of adhesive to create a layered stack.

The key step in the process is feeding the layered stack between a heated moving endless belt and a heated rotating drum. The moving endless belt is heated by at least one heater and driven by a drive assembly which is preferably motorized. In one embodiment, each heater is a radiant heater. The layered stack is compressed between the heated moving endless belt and the heated rotating drum. Heat from the heated moving endless belt and heat from the heated rotating drum laminate the web of backing material, web of cushioning material and web of ticking material to create a laminated soft good. Heat from the heated moving endless belt melts the second layer or web of adhesive between the web of second outer web of material and the web of cushioning material. The rotating drum is heated by oil located inside an interior of the drum. Heat from the heated rotating drum melts the first layer or web of adhesive between the web of first outer web of material and the web of cushioning material. The result is a three-layered laminated soft good which may be passed to a slitter or wound up in a roll for later use.

Worded another way, the method of manufacturing a laminated soft good having at least three layers comprises creating a layered stack comprising a cushioning layer, webs of adhesive on opposites side of the cushioning layer and outer layers outside the webs of adhesive. The cushioning layer may be foam or fiber or any combination thereof including at least one of the two components. The next step comprises heating an endless belt with at least one heater. In one embodiment, each heater is a radiant heater.

The heated endless belt is moved by a motorized drive assembly which includes gears and sprockets. The motorized drive assembly rotates a drive roller which moves the endless belt around several other rollers, at least one of which is manually adjustable. Rotation of the heated moving endless belt and a heated rotating drum pulls the layered stack between the heated moving endless belt and the heated rotating drum in a downstream direction. Heat from the heated moving endless belt and heat from the heated rotating drum heat both sides of the layered stack. Heat from the heated moving endless belt melts the second layer or web of adhesive between the web of second outer web of material and the web of cushioning material. The rotating drum is heated by oil located inside an interior of the drum. Heat from the heated rotating drum melts the first layer or web of adhesive between the web of first outer web of material and the web of cushioning material. The result is a three-layered laminated soft good which may be passed to a slitter or wound up in a roll for later use.

By virtue of the foregoing, there is thus provided a laminated product having at least three layers joined by melted adhesive. By heating the endless belt, the layered stack passing between the endless belt and the rotating drum is heated from both sides, melting layers of adhesive on opposite sides of a middle cushioning layer. The product or soft good may be used as borders or panels for bedding products or as outerwear for seats and cushions or any other suitable use. The use of the finished product is not intended to be limited by this document.

These and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention and, together with the general description of the invention given above and the detailed description of the embodiments given below, explain the principles of the present invention.

DETAILED DESCRIPTION OF THE DRAWINGS

Figure 1:
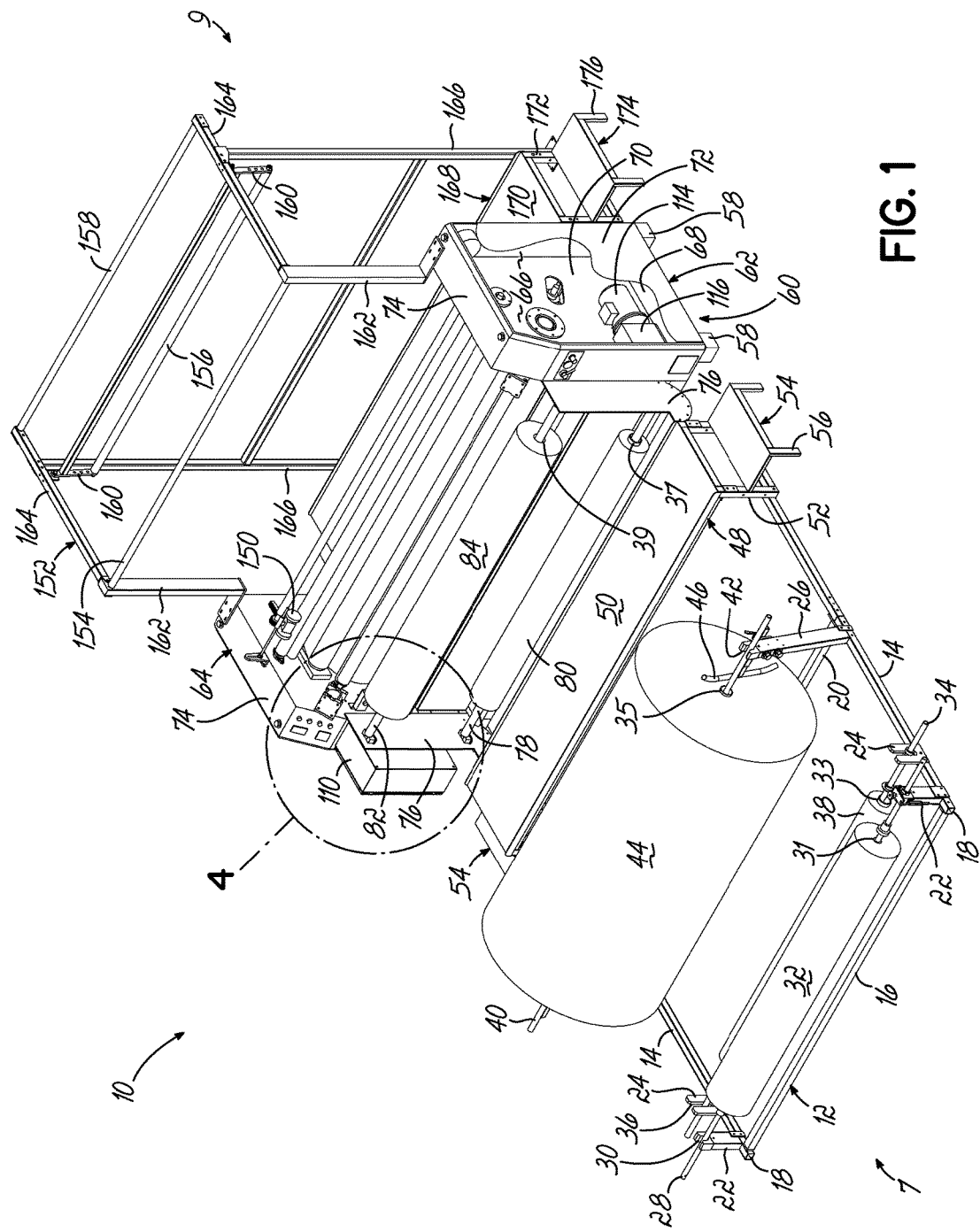
FIG. 1 is a front perspective view of the apparatus for performing the method of manufacturing a laminated soft good in accordance with the principles of the present invention.
Figure 9:
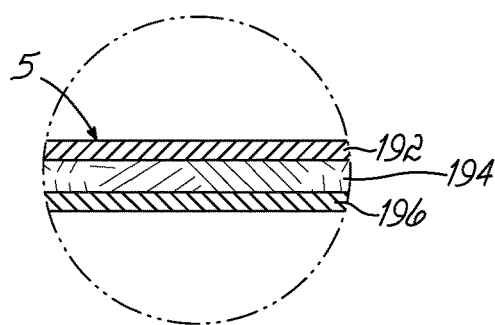
FIG. 9 is a cross-sectional view of the finished laminated soft good as shown by the encircled area 9 of FIG. 6A.

With reference to FIG. 1, there is shown an apparatus 10 for laminating three different materials together to create a laminated soft good 5 (shown in detail in FIG. 9). For purposes of this document, the apparatus 10 has a front or upstream end 7 and a rear or downstream end 9. The terms upstream and downstream refer to the flow of materials as they pass through the apparatus 10 during the method of manufacturing the laminated soft good 5 described herein.

The apparatus 10 comprises a base 12 adapted to rest on the floor of a building (not shown). The base 12 comprises two parallel runner tubes 14, a front cross tube 16 extending between the front ends 18 of the runner tubes 14, and a rear cross tube 20 extending between the runner tubes 14.

The apparatus 10 further comprises a front riser 22 extending upwardly from each of the runner tubes 14 behind or downstream of the front cross tube 16. Further downstream is a short riser 24 extending upwardly from each of the runner tubes 14 behind or downstream of the front riser 22. Even further downstream is a tall riser 26 extending upwardly from each of the runner tubes 14 behind or downstream of the small riser 24.

Figure 2:
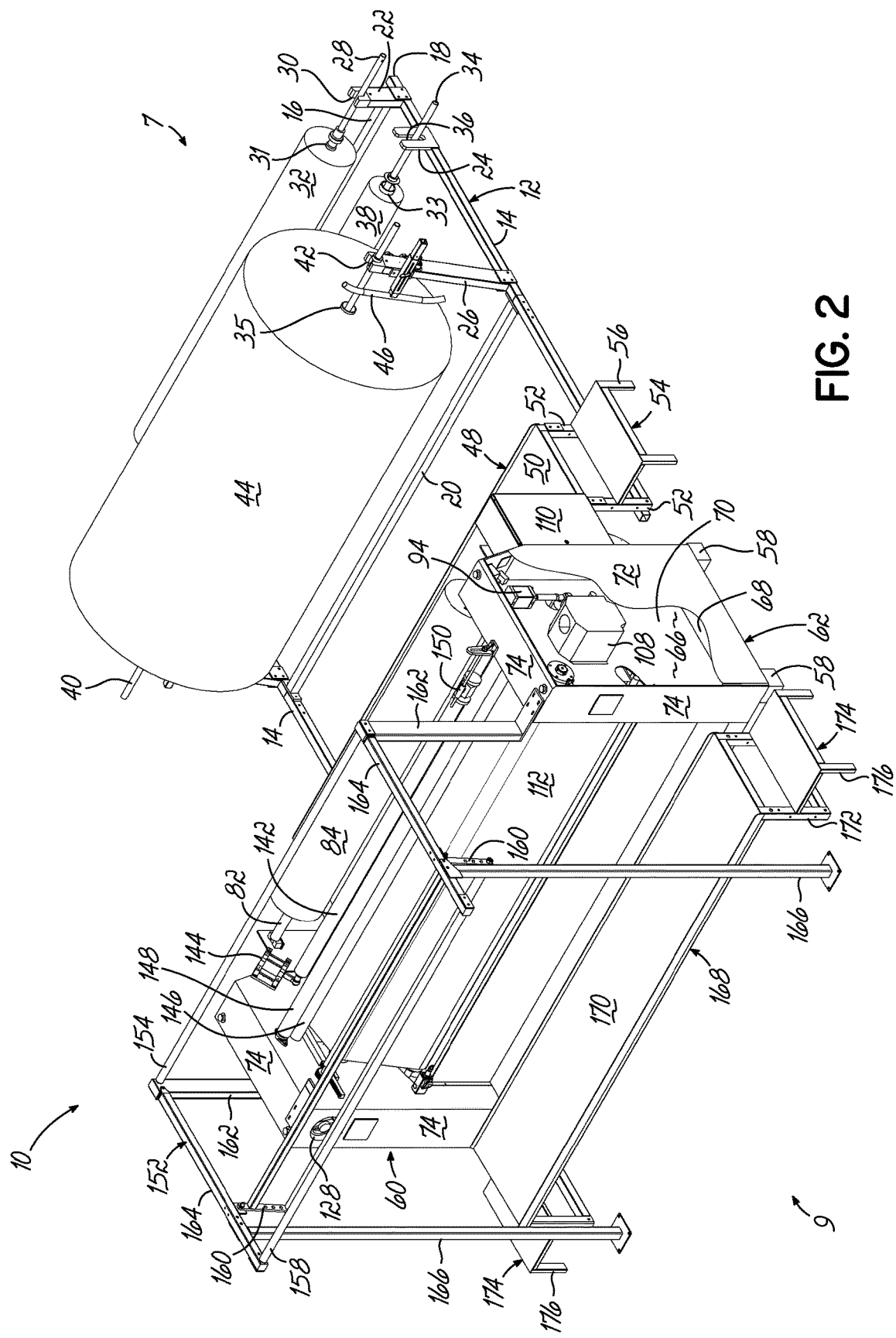
FIG. 2 is a rear perspective view of the apparatus of FIG. 1.
Figure 3:
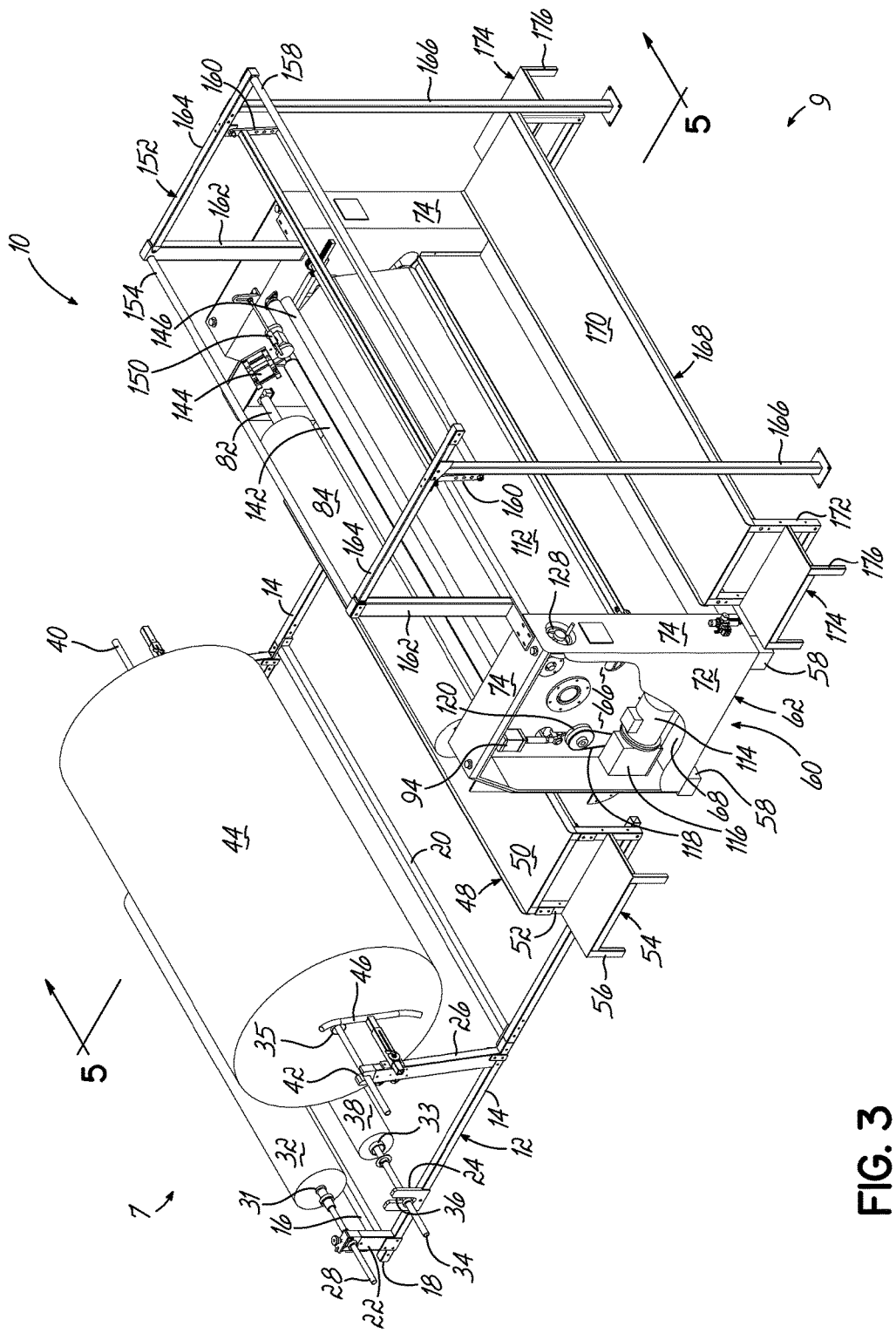
FIG. 3 is another rear perspective view of the apparatus of FIG. 1.

As best shown in FIGS. 1-3, a front support 28 extends transversely or from side-to-side and is removably supported by the front risers 22. More particularly, the front support bar 28 sits inside a downwardly extending notch 30 in each of the front risers 22. The front support bar 28 passes through a cardboard tube 31 around which backing material is rolled to create a roll of backing material 32. As best shown in FIG. 2, when the roll 32 of backing material runs out, the front support bar 28 may be lifted away from the front risers 22 quickly and easily and separated from the empty cardboard tube 31. The front support bar 28 may then be passed through a cardboard tube of a full roll 32 of backing material and lifted back into place residing inside the notches 30 of the front risers 22.

As best shown in FIGS. 1-3, a middle support bar 34 extends transversely or from side-to-side and is removably supported by the short risers 24. More particularly, the middle support bar 34 sits inside a downwardly extending notch 36 in each of the short risers 24. The middle support bar 34 passes through a cardboard tube 33 around which adhesive material is rolled to create a roll 38 of adhesive. As best shown in FIG. 2, when the roll 38 of adhesive runs out, the middle support bar 34 may be lifted away from the short risers 24 quickly and easily before being separated from the empty cardboard tube 33. The middle support bar 34 may then be passed through a cardboard tube of a full roll 38 of adhesive and lifted back into the notches 36 of the short risers 24.

As best shown in FIGS. 1-3, a rear support bar 40 extends transversely or from side-to-side and is removably supported by the tall risers 26. More particularly, the rear support bar 40 sits inside a downwardly extending notch 42 in each of the tall risers 26. The rear support bar 40 passes through a cardboard tube 35 around which cushioning material is rolled to create a roll 44 of cushioning material. As best shown in FIG. 2, when the cushioning material runs out, the rear support bar 40 may be lifted away from the tall risers 26 quickly and easily. After the cardboard tube 35 is removed from the rear support bar 40, the rear support bar 40 may be put through a cardboard tube of a full roll of cushioning material and lifted back into the notches 42 of the tall risers 26.

The apparatus 10 further comprises two manually adjustable paddle brakes 46, one on each side of the roll 44 of cushioning material. The paddle brakes 46 apply friction to the outer side surfaces of the roll 44 of cushioning material to slow the speed of rotation of the roll 44 of cushioning material.

An upstream catwalk 48 is located downstream of the tall risers 26. The upstream catwalk 48 comprises a generally planar catwalk platform 50 supported off the floor by four legs 52. The four legs 52 may be attached to the runner tubes 14 of the base 12. The upstream catwalk 48 may be used to access portions of the apparatus 10 for repairs or other purposes. An upstream step 54 supported by legs 56 is located on each side of the upstream catwalk 48 to ease access to the upstream catwalk 48.

The apparatus 10 further comprises a motorized drive assembly 60 downstream of the upstream catwalk 48. The motorized drive assembly 60 comprises a first side frame 62 and a second side frame 64, each being generally rectangular and box shaped. Each of the first and second side frames 62, 64 has a hollow interior 66 defined by a bottom 68, an inside wall 70 and an outside wall 72 spaced from the inside wall 70 and a peripheral wall 74 extending between the inside and outside walls. The bottom 68 is supported off the floor by feet 58. Although four feet 58 are illustrated lifting the bottom 68 of each of the first and second side frames 62, 64 off the floor (not shown), any number of feet of any desired configuration may be used.

The apparatus 10 further comprises two mounting plates 76, one mounting plate 76 being attached to the inside wall 70 of the first side frame 62 and the second mounting plate 76 being attached to the inside wall 70 of the second side frame 64.

Figure 4:
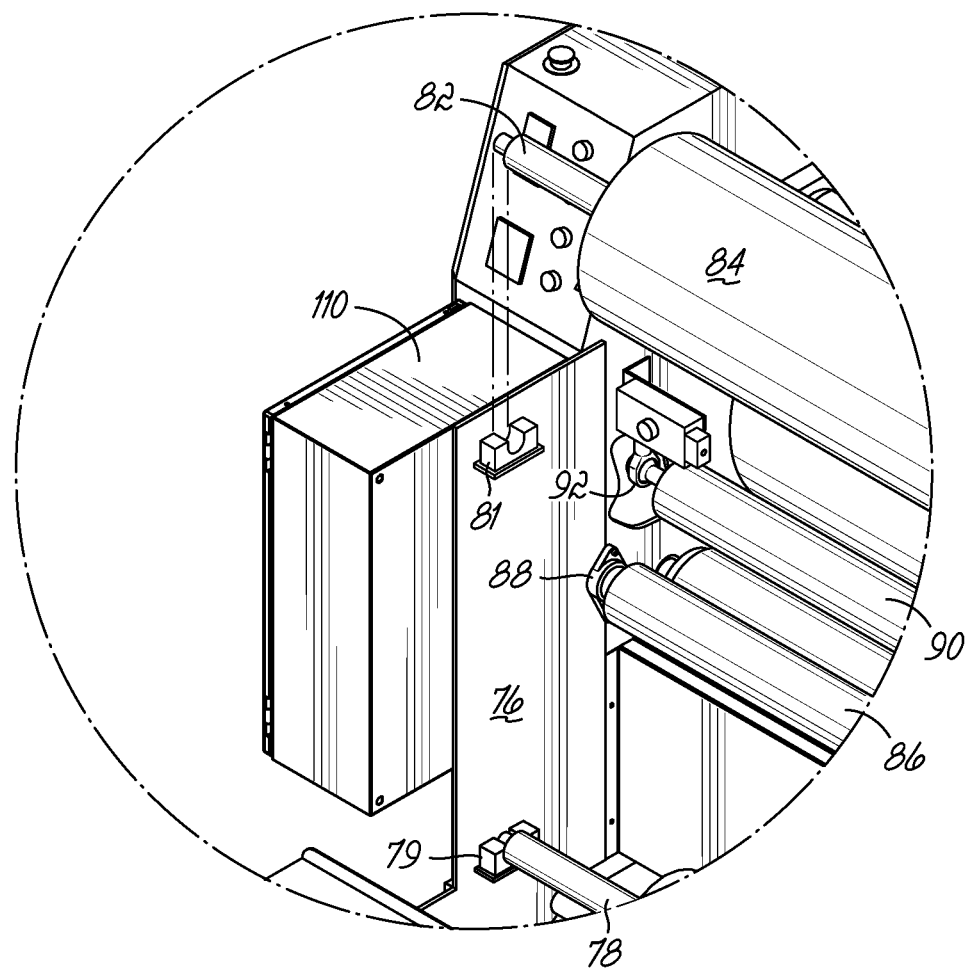
FIG. 4 is a view of the encircled area 4 of FIG. 1.

As best shown in FIGS. 1 and 4, an adhesive roll support bar 78 extends between lower mounts 79 secured to the mounting plates 76. The adhesive roll support bar 78 passes through a cardboard tube 37 around which adhesive material is rolled to create a roll 80 of adhesive. The lower mounts 79 (only one being shown in FIG. 4) are shaped to enable an operator to quickly and easily remove the adhesive roll support bar 78 once the web of adhesive wound around the adhesive roll support bar 78 is used up. Once the empty cardboard tube is separated from the adhesive roll support bar 78, the adhesive roll support bar 78 may then be passed through the cardboard tube of a full roll 80 of adhesive material and then quickly and easily lowered into engagement with the lower mounts 79. See FIG. 4.

Similarly, as best shown in FIGS. 1 and 4, an upper roll support bar 82 extends between upper mounts 81 secured to the mounting plates 76. The upper roll support bar 82 supports a roll 84 of ticking material. The upper roll support bar 82 extends through a cardboard tube 39 around which ticking material is rolled to create the roll 84 of ticking material. The upper mounts 81 (only one being shown in FIG. 4) are shaped to enable an operator to quickly and easily remove the upper roll support bar 82 once the web of ticking wound around the upper roll support bar 82 is used up. Once the empty cardboard tube is separated from the upper roll support bar 82, the upper roll support bar 82 may be passed through the cardboard tube of a full roll of ticking material. As best shown in FIG. 4, the upper roll support bar 82 supporting a full roll 84 of ticking material may be then quickly and easily lowered into engagement with the upper mounts 81.

Figure 5:
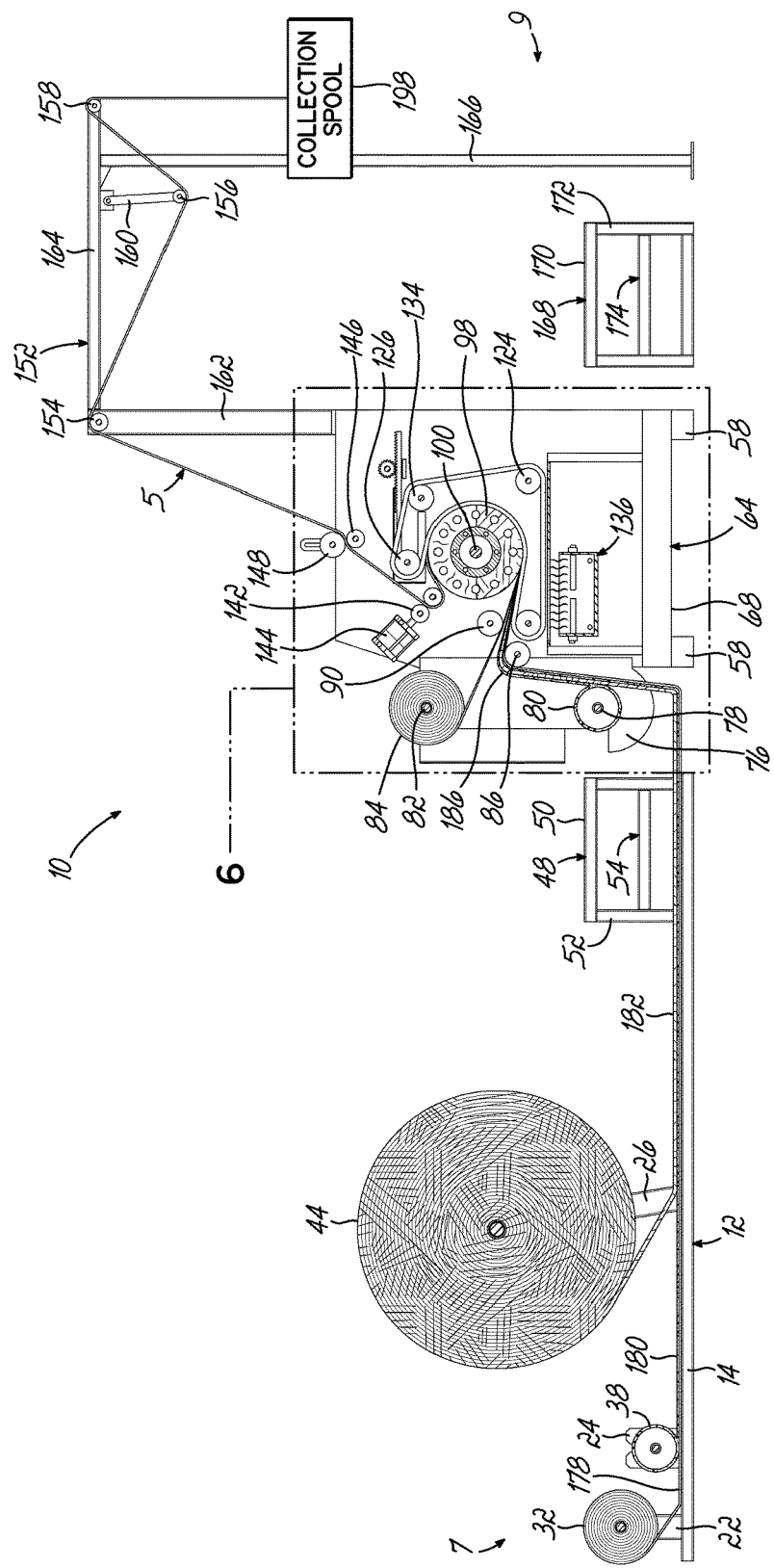
FIG. 5 is a cross-sectional view taken along the line 5-5 of FIG. 3.

As best shown in FIGS. 4 and 5, a rotatable lower compression roller 86 extends between bearings 88 secured to the inside walls 70 of the first and second side frames 62, 64.

As best shown in FIGS. 4 and 5, a rotatable pinch roller 90 extends between clevis ball bearings 92 secured to the inside walls 70 of the first and second side frames 62, 64. The location of the clevis ball bearings 92 and hence the location of the rotatable pinch roller 90 may be adjusted by two air cylinders 94 located in the interiors 66 of the first and second side frames 62, 64, respectively. See FIGS. 2 and 3.

Figure 6:
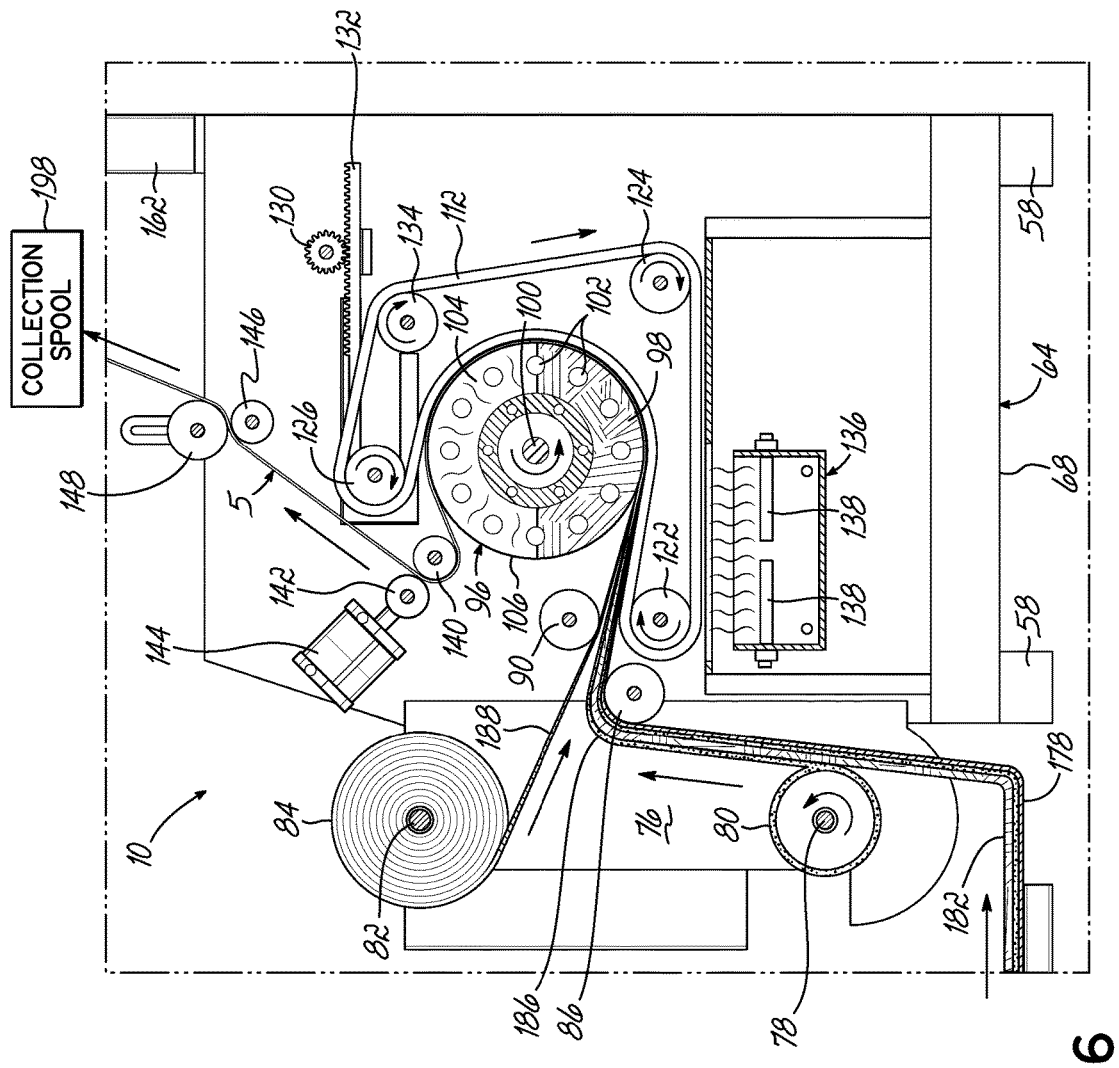
FIG. 6 is an enlarged cross-sectional view of the boxed area labeled 6 of FIG. 5.
Figure 6A:
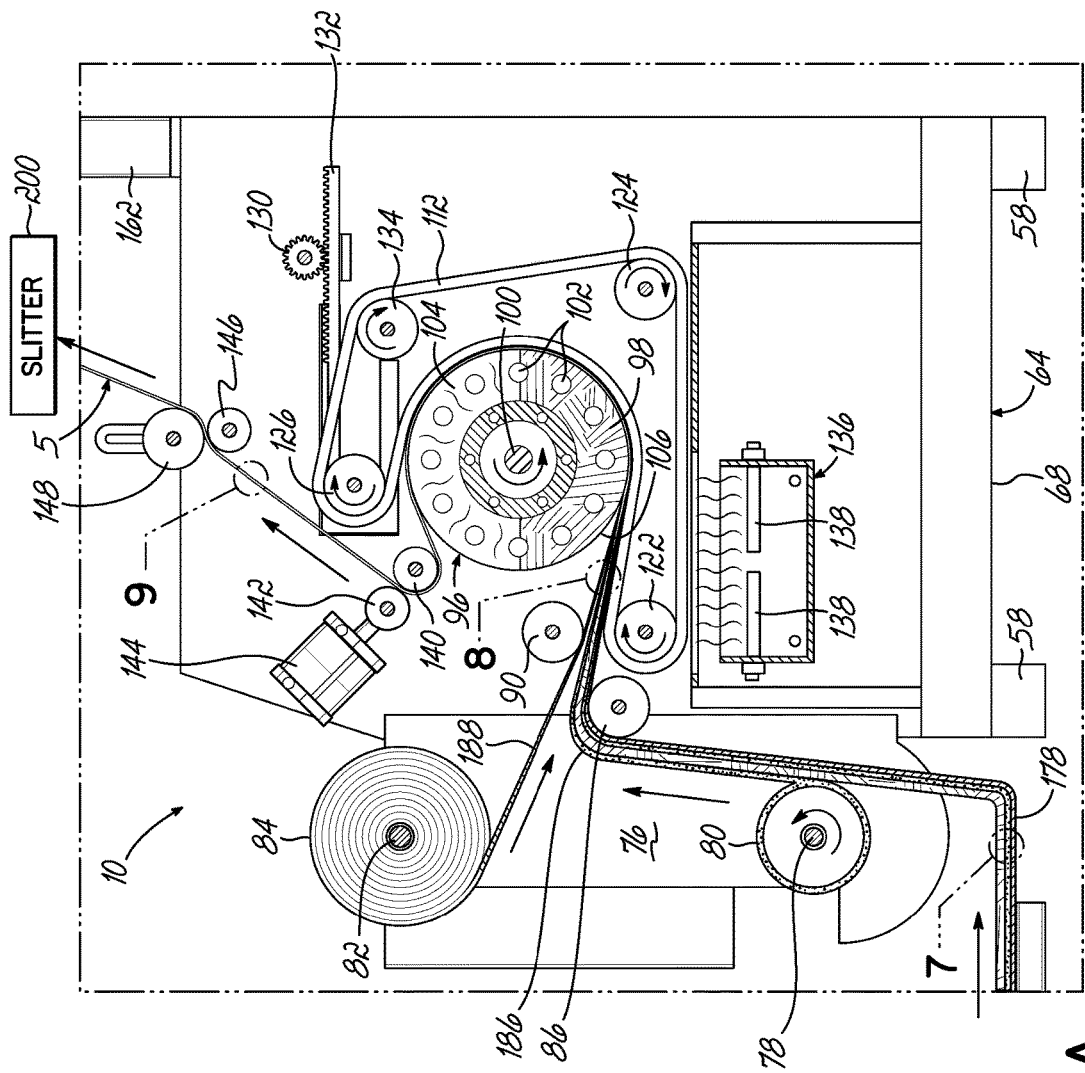
FIG. 6A is a cross-sectional view like FIG. 5A but showing the laminated material passing to a slitter rather than a collection spool.

As best shown in FIGS. 6 and 6A, the apparatus 10 further comprises a rotatable oil drum 96 having a hollow interior at least partially filled with oil 98. The rotatable oil drum 96 is mounted on a rotatable shaft 100. A plurality of heating elements 102 extend through the hollow interior 104 of the rotatable oil drum 96 to heat the oil 98 which in turn heats the exterior surface 106 of the rotatable oil drum 96. As best shown in FIG. 2, a heat shield 108 is located inside the interior 66 of the first side frame 62. The heat shield 108 protects the wiring (not shown) which heats the heating elements 102 extending through the hollow interior 104 of the rotatable oil drum 96.

As best shown in FIGS. 1 and 4, the apparatus 10 further comprises a circuit box 110 which houses some of the electronics, as one skilled in the art will appreciate.

Referring to FIGS. 1 and 3, the motorized drive assembly 60 functions to rotate an endless belt 112 described in more detail below. The motorized drive assembly 60 comprises a motor 114, a gearbox 116, a pulley 118 driven by a gear (not shown) in the gearbox 116. As best seen in FIG. 3, the pulley 118 drives a sprocket 120 which rotates a drive roller 122. As best seen in FIG. 3, the motor 114, a gearbox 116, pulley 118 and sprocket 120 are located inside the hollow interior 66 of the first side frame 62. As best seen in FIGS. 6 and 6A, rotation of the sprocket 120 rotates a drive roller 122 extending between the first and second side frames 62, 64.

As best shown in FIGS. 6 and 6A, the drive roller 122 rotates in a clockwise direction, thereby moving the endless belt 112 in a generally clockwise direction. The endless belt 112 passes around the drive roller 122, as shown in FIGS. 6 and 6A, around three other rollers including idle roller 124 located at the same generally vertical level as drive roller 122 but further downstream.

An adjustable tension roller 126 is located generally above the heated rotatable oil drum 96. The position of the tension roller 126 changes the tension on the endless belt 112. The position of the tension roller 126 is changed or adjusted via a hand crank 128 shown in FIG. 3. As best shown in FIG. 6, rotation of the hand crank 126 rotates a pinion gear 130 which moves a rack gear 132 in a front-to-back direction, thereby moving the position of the adjustable tension roller 126. As best shown in FIG. 6, the fourth roller around which the endless belt 112 passes is another idle roller 134.

As best shown in FIGS. 6 and 6A, the apparatus 10 further comprises a radiant heater 136 residing beneath the lower horizontally oriented portion of endless belt 112. Although only one radiant heater 136 is shown, any number of heaters of any known type may be used to heat the endless belt 112 before the heated portion of the endless belt 112 contacts the layered stack of materials to be laminated. As best shown in FIGS. 6 and 6A, the radiant heater 136 has two electrodes 138.

As best shown in FIGS. 6 and 6A, the apparatus 10 further comprises another idle roller 140 downstream of the rotatable oil drum 96. The finished laminated soft good 5, shown in cross-section in detail in FIG. 9, passes between the idle roller 140 and a nip roller 142. The position of the nip roller 142 is controlled by two air cylinders 144 (only one being shown in FIGS. 6 and 6A). As best shown in FIGS. 6 and 6A, the apparatus 10 further comprises another roller 146 which is used with an upper roller 148 to pass the finished laminated soft good 5 further downstream. The apparatus 10 further comprises a distance counter 150.

The apparatus 10 further comprises a rack 152 downstream of the cylinders 146, 148. The rack 152 comprises two arms 162 secured to the first and second side frames 62, 64, two extension arms 164 extending rearwardly from arms 162, an upstream rack roller 154 extending between the extension arms 164, a middle roller 156 extending between hangers 160 and a downstream rack roller 158 extending between the extension arms 164. The rack 152 further comprises rear legs 166.

The apparatus 10 further comprises a downstream catwalk 168 is located underneath the rack 152. The downstream catwalk 168 comprises a generally planar catwalk platform 170 supported off the floor by four legs 172. The downstream catwalk 168 may be used to access portions of the apparatus 10 for repairs or any other desired purpose. A downstream step 174 supported by legs 176 is located on each side of the downstream catwalk 168 to ease access to the downstream catwalk 168.

Figure 5A:
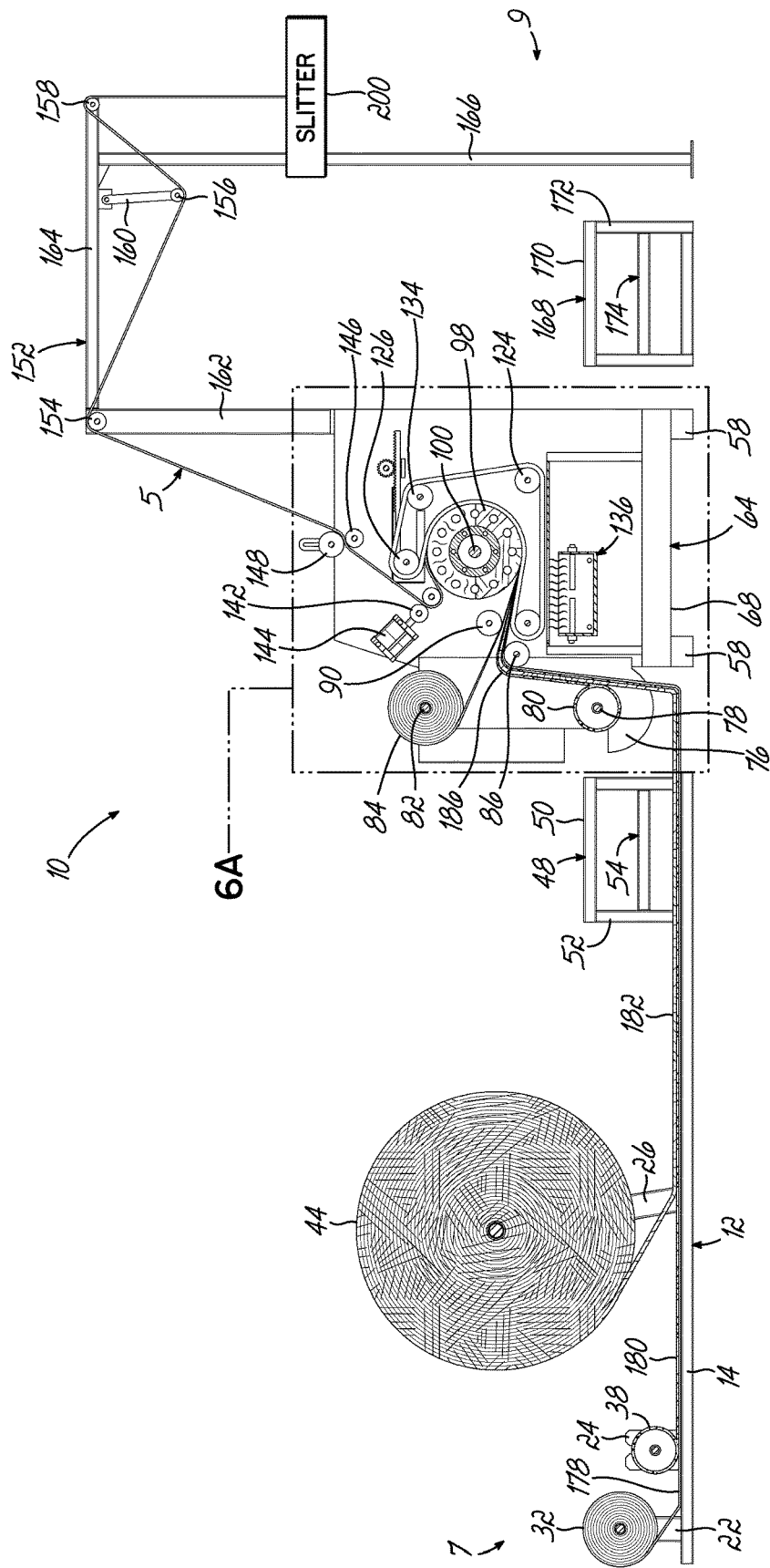
FIG. 5A is a cross-sectional view like FIG. 5 but showing the laminated material passing to a slitter rather than a collection spool.
Figure 7:
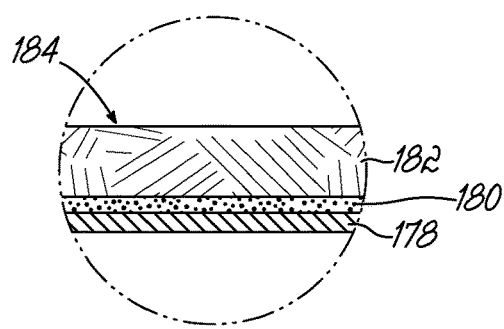
FIG. 7 is a cross-sectional view of the sub-stack before the final two webs of material are added as shown by the encircled area 7 of FIG. 6A.

In use, referring to FIGS. 5 and 5A, a web of backing material 178 is unwound from the roll 32 of backing material and pulled downstream. A first web of adhesive 180 is unwound from the roll 38 of adhesive and pulled downstream. As shown in FIG. 7, the first web of adhesive 180 is above the web of backing material 178 as the webs are pulled downstream. Simultaneously, a web of cushioning material 182 is unwound from the roll 44 of cushioning material and pulled downstream. As shown in FIG. 7, the web of cushioning material 182 is above the first web of adhesive 180 as the webs are pulled downstream. As shown in FIG. 7, the three webs of material 178, 180, 182 form a sub-stack 184 which is pulled upwardly or downstream by the operation of the drive assembly 60.

Figure 8:
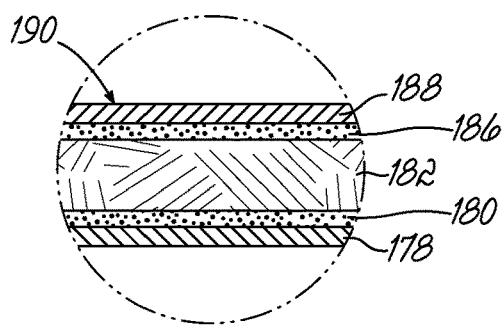
FIG. 8 is a cross-sectional view of the layered stack before being laminated as shown by the encircled area 8 of FIG. 6.

As best shown in FIGS. 6 and 6A, as the sub-stack 184 is pulled downstream by the operation of the drive assembly 60, a second web of adhesive 186 is unwound from the roll 80 of adhesive and pulled downstream adjacent the web of cushioning material 182. As shown in FIG. 8, the second web of adhesive 186 is above the web of cushioning material 182 as the webs are pulled downstream. Simultaneously, a web of ticking material 188 is unwound from the roll 84 of ticking material and pulled downstream. As shown in FIG. 8, the web of ticking material 188 is above the second web of adhesive 186 as the webs are pulled downstream. As shown in FIG. 8, the five webs of material 178, 180, 182, 186, 188 form a layered stack 190 comprising five layers which is pulled upwardly or downstream by the operation of the drive assembly 60.

By virtue of the foregoing, there is thus provided a finished laminated soft good 5 shown in FIG. 9. FIG. 9 shows a first outer layer or ticking layer 192, a middle cushioning layer 194 and a second outer layer or backing layer 196. The heat applied from both sides melts the layers of adhesive of the layered stack during the manufacturing process.

As shown in FIGS. 5 and 5A, after the finished laminated soft good 5 passes over the frame 152 and more particularly, over upstream rack roller 154 extending between the extension arms 164, under middle roller 156 extending between hangers 160 and over downstream rack roller 158 extending between the extension arms 164, the finished laminated soft good 5 may extend to a collection spool 198 as shown in FIG. 5 or to a slitter 200. FIGS. 6 and 6A, show the finished laminated soft good 5 passing generally to either a collection spool 198 or to a slitter 200.

Although encircled areas 7, 8 and 9 are shown on FIG. 6A, they may just as well be on FIG. 6. It does not matter whether the finished laminated soft good 5 passes to a collection spool 198 or to a slitter 200; either way the inventive aspects of the present invention are the same. The heated endless belt 112 enables five layers, as opposed to only three layers in the prior art, to be laminated together using a heated oil drum.

While the present invention has been illustrated by the description of embodiments thereof, and while the embodiments have been described in considerable detail, it is not intended to restrict or in any way limit the scope of the appended claims to such detail. Additional advantages and modifications will readily appear to those skilled in the art. For example, more than five layers may be laminated together. The invention in its broader aspects is, therefore, not limited to the specific details, representative apparatus and method, and illustrative examples shown and described. Accordingly, departures may be made from such details without departing from the spirit or scope of the general inventive concept.

Having described the invention, what is claimed is:

1. A method of manufacturing a laminated soft good, said method comprising:
   creating a layered stack comprising a cushioning layer, webs of adhesive on opposite sides of the cushioning layer and outer layers outside the webs of adhesive;
   heating an endless belt with a radiant heater;
   moving the heated endless belt via a motorized drive assembly thereby pulling the layered stack between a heated rotating drum and the heated moving endless belt downstream; and
   heating both sides of the layered stack by passing the layered stack between the heated moving endless belt and the heated rotating drum, heat from the heated endless belt and the heated rotating drum laminating the cushioning layer to the outer layers to create a laminated soft good.

2. The method of claim 1, wherein the radiant heater is below the heated endless belt.

3. The method of claim 1, wherein one of the outer layers contacts the heated rotating drum and the other outer layer contacts the heated endless belt.

4. The method of claim 1, wherein moving the heated endless belt via a motorized driver includes using a motor to rotate a drive roller.

5. The method of claim 1, wherein compressing the layered stack comprises passing the layered stack between an adjustable pinch roller and the drive roller.

6. The method of claim 1, wherein the heated endless belt is driven by at least one drive roller.

7. The method of claim 1, wherein the heated endless belt passes around several idle rollers.

8. The method of claim 1, wherein the cushioning layer comprises at least one of foam and fiber.

9. A method of manufacturing a laminated soft good, said method comprising:
   creating a layered stack comprising a cushioning layer, webs of adhesive on opposite sides of the cushioning layer and outer layers outside the webs of adhesive;
   heating a rotating drum with oil;
   moving a heated endless belt via a motorized drive assembly thereby pulling the layered stack between the heated rotating drum and the heated moving endless belt; and
   heating both sides of the layered stack by passing the layered stack between the heated moving endless belt and the heated rotating drum, heat from the heated endless belt and the heated rotating drum laminating the cushioning layer to the outer layers to create a laminated soft good.

10. The method of claim 9, wherein the heated endless belt passes around at least three rollers.

11. The method of claim 10, wherein the at least three rollers includes at least one drive roller and at least two idle rollers.

12. The method of claim 9, wherein compressing the layered stack comprises passing the layered stack between an adjustable pinch roller and a drive roller.

13. The method of claim 9, wherein the cushioning layer comprises at least one of foam and fiber.

14. A method of manufacturing a laminated soft good, said method comprising:
   creating a layered stack comprising a cushioning layer, webs of adhesive on opposite sides of the cushioning layer and outer layers outside the webs of adhesive;
   heating an endless belt with a first heater;
   heating a rotating drum with a second heater;

moving the heated endless belt via a motorized drive assembly thereby pulling the layered stack between the heated rotating drum and the heated moving endless belt; and heating first and second opposite sides of the layered stack by passing the layered stack between the heated moving endless belt and the heated rotating drum, heat from the heated endless belt and the heated rotating drum laminating the cushioning layer to the outer layers to create a laminated soft good.

15. The method of claim 14, wherein the first side of the layered stack contacts the heated rotating drum and the second side of the layered stack contacts the heated endless belt.

16. The method of claim 14, wherein the first heater is a radiant heater.

17. The method of claim 14, wherein the second heater heats oil inside the rotating drum.

18. The method of claim 14, wherein compressing the layered stack comprises passing the layered stack between an adjustable pinch roller and a drive roller.

19. The method of claim 14, wherein the cushioning layer comprises at least one of foam and fiber.

20. The method of claim 14, wherein at least one of the first and second heaters includes a radiant heater.

* * * * *